(12) United States Patent
Yuge

(10) Patent No.: US 10,971,734 B2
(45) Date of Patent: *Apr. 6, 2021

(54) PLANAR STRUCTURAL BODY CONTAINING FIBROUS CARBON NANOHORN AGGREGATE

(71) Applicant: NEC CORPORATION, Tokyo (JP)

(72) Inventor: Ryota Yuge, Tokyo (JP)

(73) Assignee: NEC CORPORATION, Tokyo (JP)

( * ) Notice: Subject to any disclaimer, the term of this patent is extended or adjusted under 35 U.S.C. 154(b) by 142 days.

This patent is subject to a terminal disclaimer.

(21) Appl. No.: 16/085,309

(22) PCT Filed: Feb. 28, 2017

(86) PCT No.: PCT/JP2017/007794
§ 371 (c)(1),
(2) Date: Sep. 14, 2018

(87) PCT Pub. No.: WO2017/159351
PCT Pub. Date: Sep. 21, 2017

(65) Prior Publication Data
US 2019/0081330 A1 Mar. 14, 2019

(30) Foreign Application Priority Data
Mar. 16, 2016 (JP) .............................. JP2016-052229

(51) Int. Cl.
*H01M 4/96* (2006.01)
*C01B 32/18* (2017.01)
(Continued)

(52) U.S. Cl.
CPC ............... *H01M 4/96* (2013.01); *C01B 32/18* (2017.08); *D01F 9/12* (2013.01); *H01G 11/00* (2013.01);
(Continued)

(58) Field of Classification Search
CPC .... H01M 4/587; H01M 4/96; H01M 10/0525; C01B 32/18; C01P 2004/16;
(Continued)

(56) References Cited

U.S. PATENT DOCUMENTS 8,084,505 B2 * 12/2011 Yuge ...................... B82Y 30/00
424/489
9,567,222 B2 * 2/2017 Jung ....................... C01B 32/16
(Continued)

FOREIGN PATENT DOCUMENTS

JP   2003-146606 A   5/2003
JP   2003-313571 A   11/2003
(Continued)

OTHER PUBLICATIONS

Machine translation of Chin (JP2008248457A), publication date Oct. 16, 2008.*

(Continued)

*Primary Examiner* — Jun Li
(74) *Attorney, Agent, or Firm* — Sughrue Mion, PLLC

(57) ABSTRACT

There is provided a planar structural body 1 comprising a fibrous carbon nanohorn aggregate 2 in which a plurality of single-walled carbon nanohorns are aggregated in a fibrous state, and particularly the planar structural body in which a globular carbon nanohorn aggregate 3 is mixed is used. The planar structural body comprising such a fibrous carbon nanohorn aggregate can be used for electrode materials for lithium ion batteries, fuel cells, capacitors, electrochemical actuators, air cells, solar cells, and the like, and can be used also for electromagnetic shields, thermoconductive sheets, heat-dissipating sheets, protecting sheets, filters and absorbing materials.

19 Claims, 5 Drawing Sheets

(51) Int. Cl.
   *H01M 10/0525* (2010.01)
   *H01L 31/18* (2006.01)
   *H01M 4/587* (2010.01)
   *H01G 11/00* (2013.01)
   *H01L 51/00* (2006.01)
   *D01F 9/12* (2006.01)
   *B82Y 30/00* (2011.01)
   *H01L 51/10* (2006.01)
   *H01L 51/44* (2006.01)

(52) U.S. Cl.
   CPC ...... *H01L 31/1884* (2013.01); *H01L 51/0048* (2013.01); *H01M 4/587* (2013.01); *H01M 10/0525* (2013.01); *B82Y 30/00* (2013.01); *C01P 2004/03* (2013.01); *C01P 2004/16* (2013.01); *C01P 2006/40* (2013.01); *H01L 51/102* (2013.01); *H01L 51/444* (2013.01)

(58) Field of Classification Search
   CPC .... H01G 11/00; H01G 11/36; H01L 31/1884; H01L 51/0048; H01L 51/102; H01L 51/444
   See application file for complete search history.

(56) References Cited

U.S. PATENT DOCUMENTS

| | | | | |
|---|---|---|---|---|
| 10,703,633 | B2* | 7/2020 | Yuge | C08J 5/042 |
| 10,710,051 | B2* | 7/2020 | Yuge | B01J 20/205 |
| 10,793,439 | B2* | 10/2020 | Yuge | H01M 4/625 |
| 10,813,257 | B2* | 10/2020 | Yuge | C01B 32/18 |
| 2005/0116602 | A1* | 6/2005 | Iijima | H01J 1/3048 |
| | | | | 313/311 |
| 2010/0329966 | A1* | 12/2010 | Fugetsu | C01B 32/174 |
| | | | | 423/447.1 |
| 2014/0057097 | A1* | 2/2014 | Liu | C01B 32/18 |
| | | | | 428/323 |
| 2014/0072504 | A1* | 3/2014 | Goino | B01J 20/3078 |
| | | | | 423/445 R |
| 2015/0060721 | A1* | 3/2015 | Muramatsu | B29B 13/021 |
| | | | | 252/62 |
| 2018/0105425 | A1* | 4/2018 | Yuge | B01J 37/34 |
| 2019/0189358 | A1* | 6/2019 | Yuge | B82Y 30/00 |

FOREIGN PATENT DOCUMENTS

| | | |
|---|---|---|
| JP | 3479889 B2 | 12/2003 |
| JP | 2004-016976 A | 1/2004 |
| JP | 2005-039295 A | 2/2005 |
| JP | 3989256 B2 | 10/2007 |
| JP | 2008-248457 A | 10/2008 |
| JP | 4234812 B2 | 3/2009 |
| JP | 4873870 B2 | 2/2012 |
| JP | 2014-012921 A | 1/2014 |
| JP | 5384917 B2 | 1/2014 |
| WO | 2008/139963 A1 | 11/2008 |
| WO | 2013/183187 A1 | 12/2013 |
| WO | 2015/146984 A1 | 10/2015 |
| WO | 2015/186742 A1 | 12/2015 |

OTHER PUBLICATIONS

Srivastava et al, Growth, Structure and field emission charactireists of petal like carbon nano-strucutred thin films, This Solid Films, 492 (2005) 124-130.*

Yuge et al., Highly Efficient Field Emission from Carbon NanotubeNanohorn Hybrids Prepared by Chemical Vapor Deposition, ACS NAno, 2010, vol. 4 No. 12 7337-7343.*

Researchers report the world's first fibrous aggregate of carbon nanohorns, NEC corporation, Jul. 7, 2016.*

International Search Report for PCT/JP2017/007794, dated Jun. 6, 2017.

* cited by examiner

[FIG. 1 (A)]
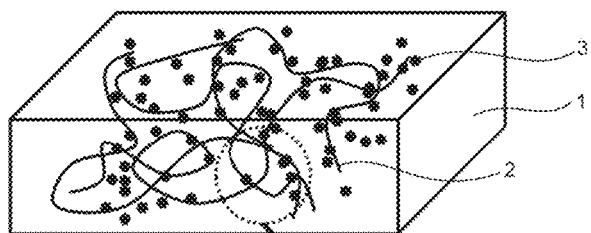
[FIG. 1 (B)]
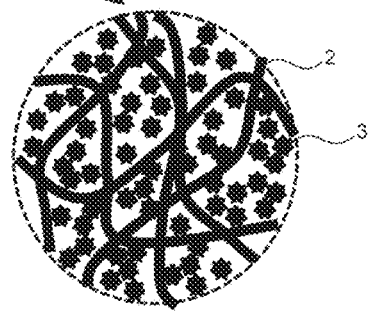
[FIG. 2]
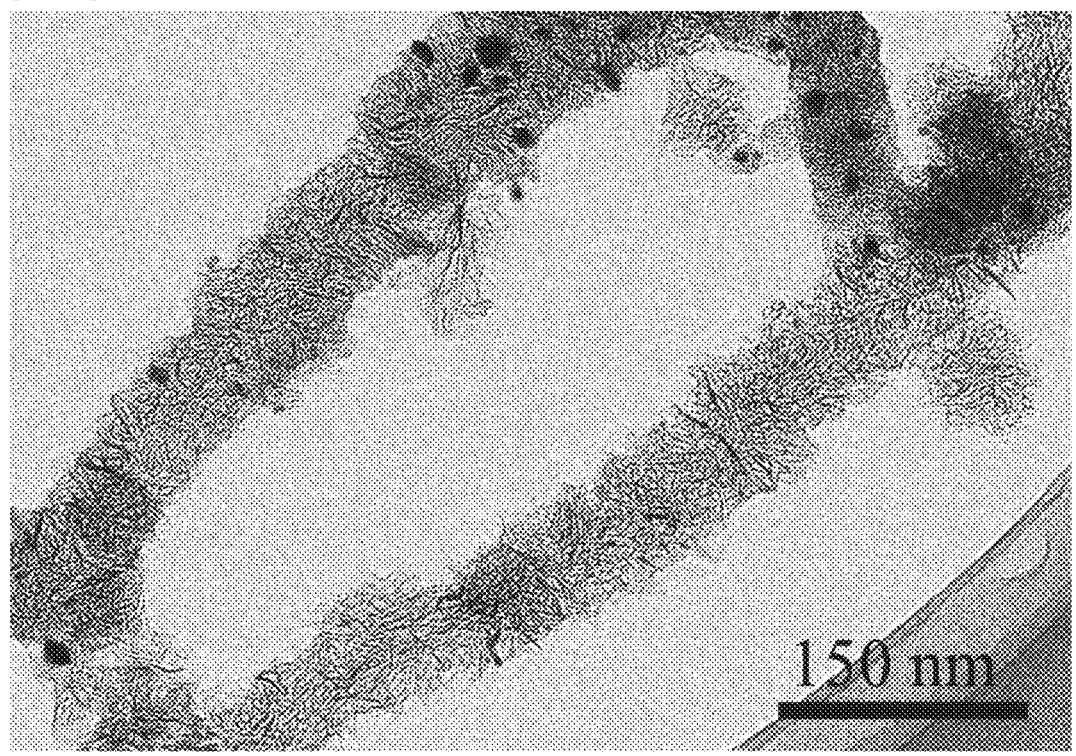

[FIG. 3]
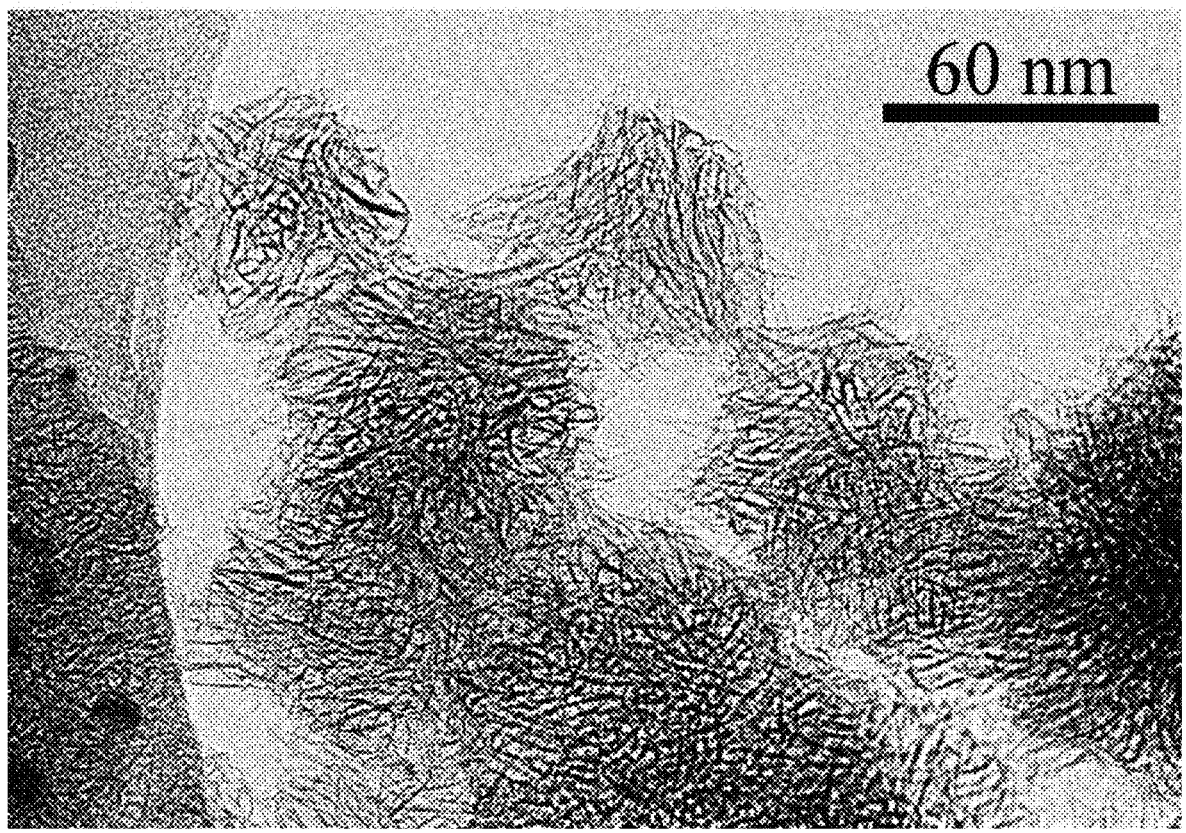

[FIG. 4]
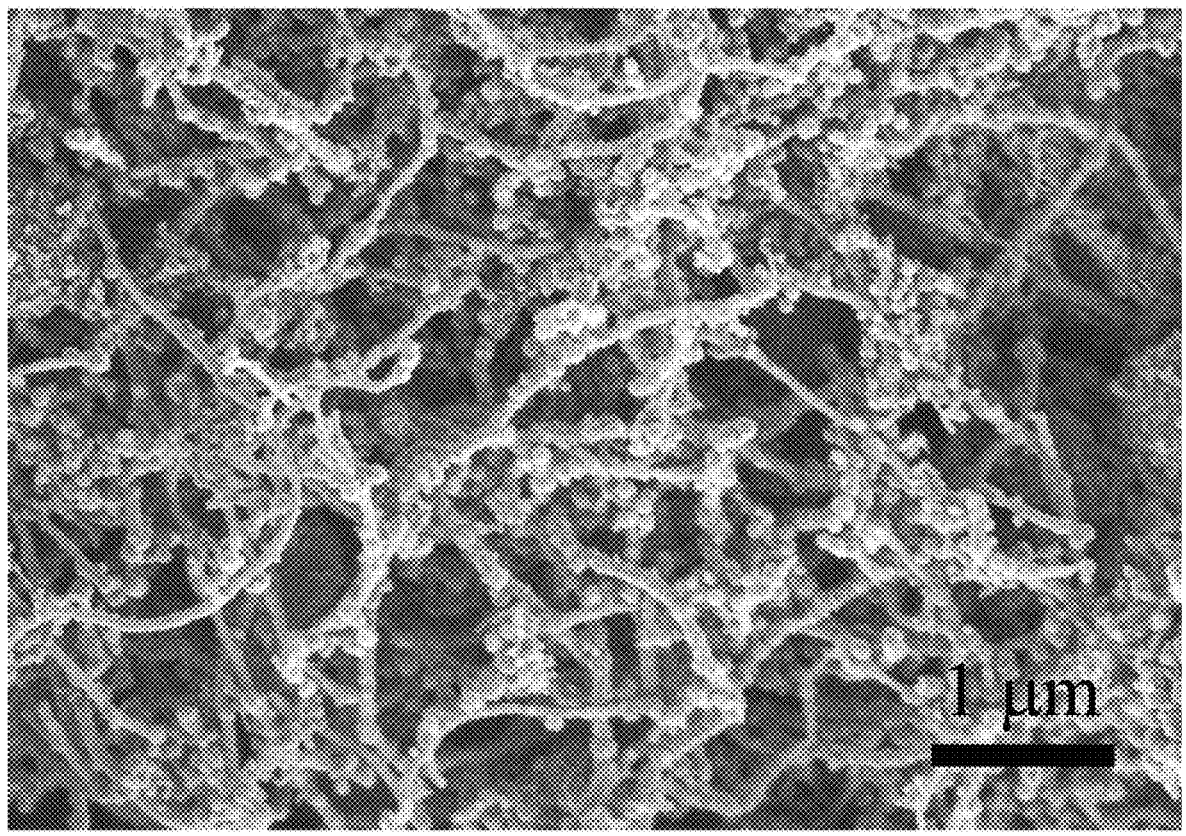

[FIG. 5]
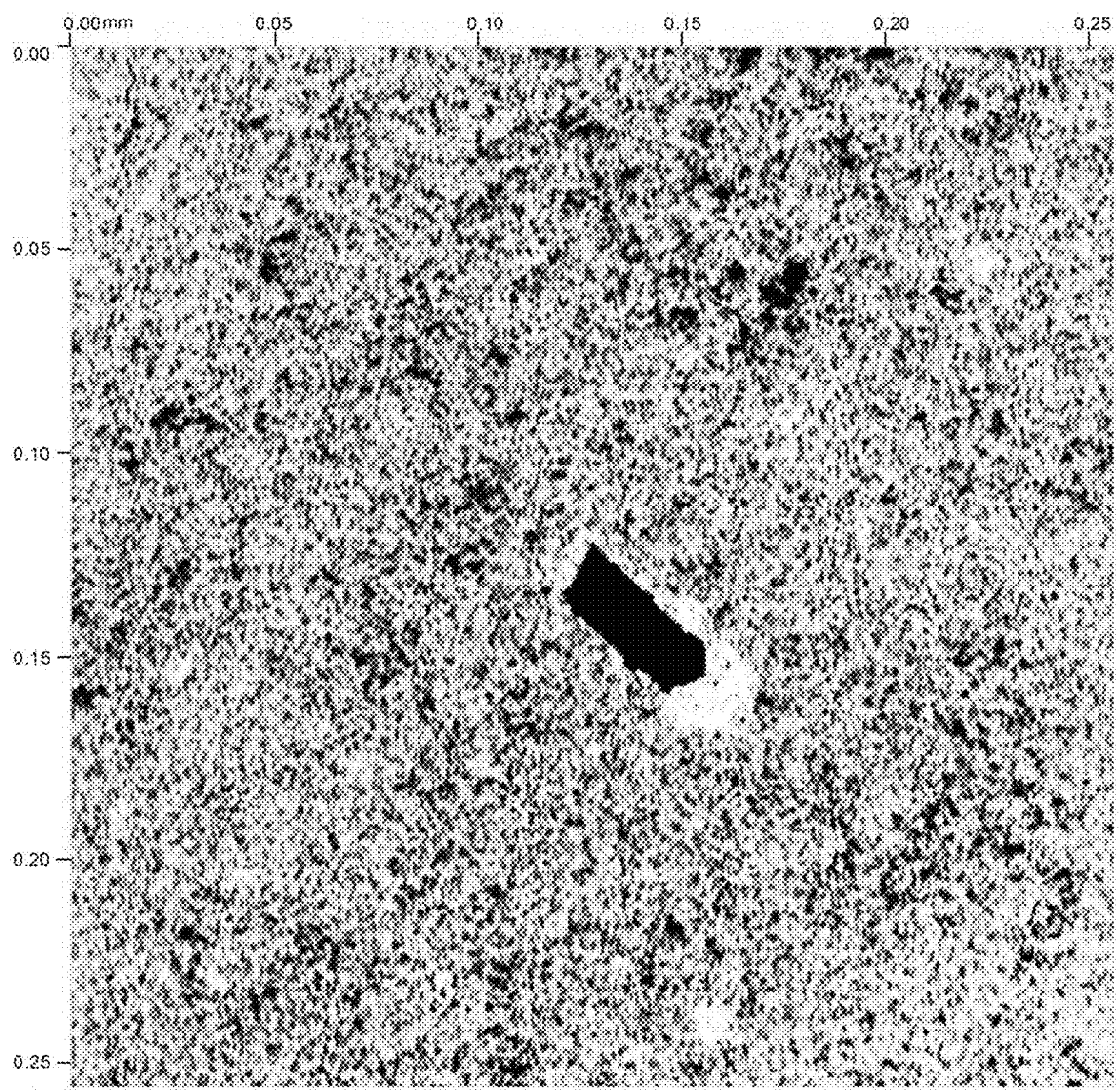

[FIG. 6]
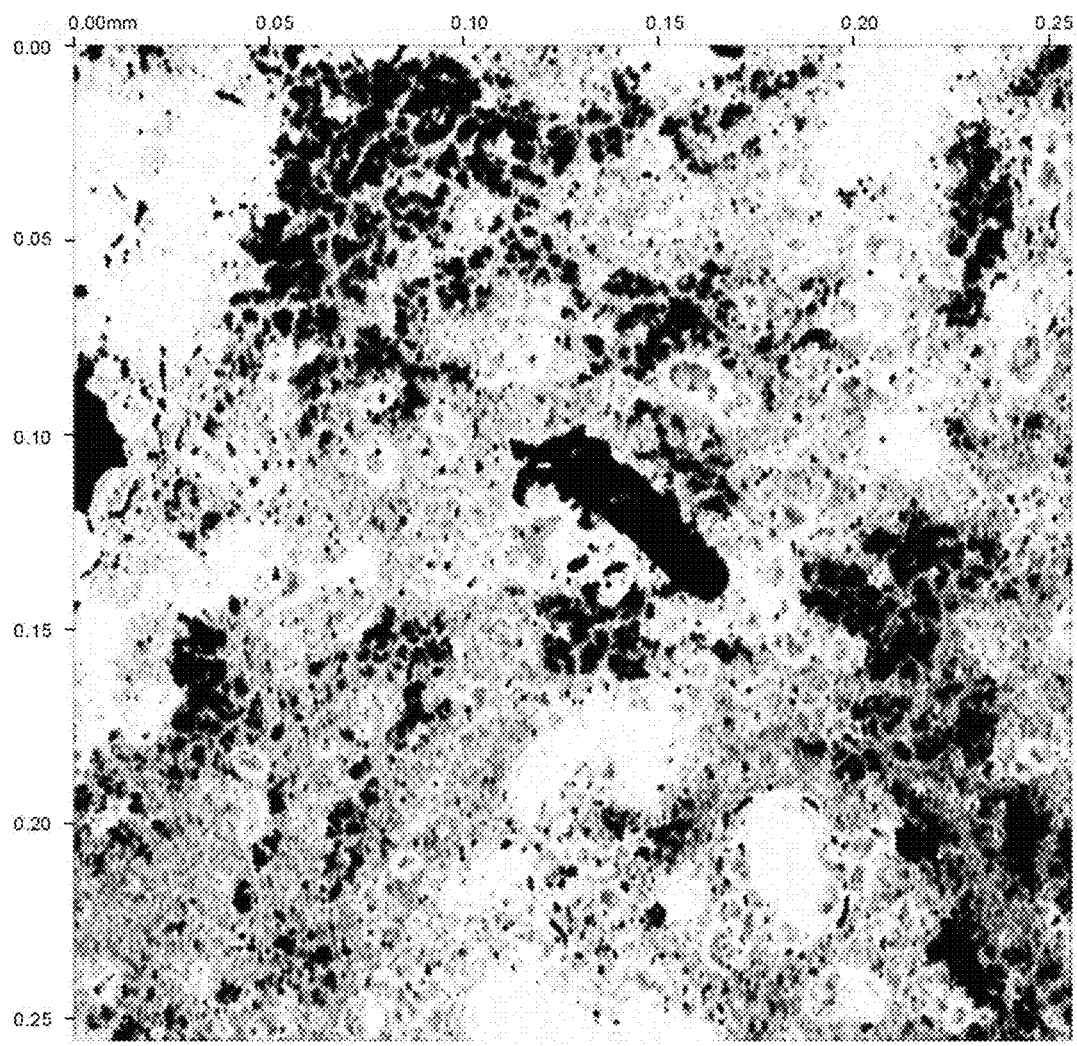

PLANAR STRUCTURAL BODY CONTAINING FIBROUS CARBON NANOHORN AGGREGATE

CROSS REFERENCE TO RELATED APPLICATIONS

This Application is a National Stage of International Application No. PCT/JP2017/007794 filed Feb. 28, 2017, claiming priority based on Japanese Patent Application No. 2016-052229 filed Mar. 16, 2016, the entire disclosure of which is incorporated herein by reference.

TECHNICAL FIELD

The present invention relates to a planar structural body containing a fibrous carbon nanohorn aggregate.

BACKGROUND ART

Carbon materials are conventionally utilized as conductive materials, catalyst carriers, adsorbents, separating agents, inks, toners and the like; in recent years, on emergence of nano-carbon materials of nano size, such as carbon nanotubes and carbon nanohorns, features as their structural bodies have been paid attention to, and their applications have been energetically studied as described in the following: Patent Literature 1 (carbon nanohorn), Patent Literature 2 (DDS), Patent Literature 3 (solid lubricant), Patent Literature 4 (occlusion of methane gas), Patent Literature 5 (adsorbent), Patent Literature 6 (methane-cracking catalyst), Patent Literature 7 (catalyst carrier) and Patent Literature 8 (conductive material).

CITATION LIST

Patent Literature

Patent Literature 1: JP4234812B
Patent Literature 2: JP4873870B
Patent Literature 3: JP2003-313571A
Patent Literature 4: JP2004-16976A
Patent Literature 5: JP3989256B
Patent Literature 6: JP2003-146606A
Patent Literature 7: JP3479889B
Patent Literature 8: JP5384917B

SUMMARY OF INVENTION

Technical Problem

Such nano-carbon materials are used in each application as a shape making use of characteristics of the respective materials. There are cases of being used particularly as planar structural bodies such as thin films, sheets and plates.

When a planar structural body such as a thin film is fabricated, however, a problem is that since carbon nanotubes can hardly be dispersed, the carbon nanotubes can hardly be made into a paste, so it is difficult to fabricate a uniform thin film. On the other hand, conventional carbon nanohorn aggregates are globular structures and highly dispersed, and can be easily made into a paste, but a problem is that when a thin film is fabricated, since the aggregates are re-aggregated during drying after application, it is difficult to form a uniform thin film. Further another problem is that when a globular structure is made into a thin film, the thin film cannot be made from the carbon nanohorn aggregates alone, and a binder (binding material) is needed.

An object of the present invention is to provide a planar structural body containing a carbon nanohorn aggregate and being excellent in uniformity.

Solution to Problem

Then, as a result of exhaustive studies on a planar structural body containing a carbon nanohorn aggregate, the present inventor has found that use of a fibrous carbon nanohorn aggregate found by the present inventor can provide a planar structural body excellent in uniformity.

That is, according to one aspect of the present invention, there is provided a planar structural body including a fibrous carbon nanohorn aggregate in which a plurality of single-walled carbon nanohorns are aggregated in a fibrous state.

Further according to another aspect of the present invention, the fibrous carbon nanohorn aggregate includes at least one of seed-shaped, dahlia-shaped, bud-shaped, petal-dahlia-shaped and petal-shaped carbon nanohorn aggregates, connected in a fibrous state.

Further, the planar structural body includes at least one of seed-shaped, bud-shaped, dahlia-shaped, petal-dahlia-shaped and petal-shaped globular carbon nanohorn aggregates, not constituting the fibrous carbon nanohorn aggregate.

Further, a part of the single-walled carbon nanohorn contained in the carbon nanohorn aggregate has an opening portion.

There is further provided a planar structural body wherein the carbon nanohorn aggregate includes at least one of carbon, a carbon compound, a metal, a semimetal and an oxide.

The planar structural body including the fibrous carbon nanohorn aggregate according to one aspect of the present invention has a thickness of 100 nm to 10 mm. In addition, the fibrous carbon nanohorn aggregate has a diameter of 30 nm to 200 nm, and a length of 1 μm to 100 μm. Further, each of the single-walled carbon nanohorns has a diameter of 1 nm to 5 nm, and a length of 30 nm to 100 nm, and has a horn-shaped tip.

Advantageous Effect of Invention

According to the present invention, a uniform planar structural body is provided by using a fibrous carbon nanohorn aggregate.

BRIEF DESCRIPTION OF DRAWINGS

FIGS. 1(A) and 1(B) are schematic views of a planar structural body including a fibrous carbon nanohorn aggregate, fabricated in the present invention.

FIG. 2 is a transmission electron microscope image of a fibrous carbon nanohorn aggregate, fabricated in the present invention.

FIG. 3 is a transmission electron microscope image of globular carbon nanohorn aggregates fabricated together with a fibrous carbon nanohorn aggregate.

FIG. 4 is a scanning electron microscope image of fibrous carbon nanohorn aggregates and globular carbon nanohorn aggregates fabricated in the present invention.

FIG. 5 is a laser microscope image showing a surface condition of a thin film fabricated from a mixture of fibrous carbon nanohorn aggregates and globular carbon nanohorn aggregates fabricated in the present invention.

FIG. 6 is a laser microscope image showing a surface condition of a thin film fabricated from globular carbon nanohorn aggregates alone.

DESCRIPTION OF EMBODIMENT

The present invention has the characteristics as described above, but an example embodiment will be described hereinafter.

FIGS. 1(A) and 1(B) are schematic views of a planar structural body comprising a fibrous carbon nanohorn aggregate according to an example embodiment. FIG. 1(B) is an enlarged view of FIG. 1(A). Here, a planar structural body 1 includes a fibrous carbon nanohorn aggregate 2, and can include a globular carbon nanohorn aggregate 3.

Since the fibrous carbon nanohorn aggregate 2, unlike conventional fibrous substances, has high dispersibility, and can easily be mixed with other substances. Further, since the fibrous carbon nanohorn aggregate prevents re-aggregation at the time of drying after coating with a paste mixed with a solvent or the like, a uniform planar structural body having excellent moldability is formed. In addition, since fibrous structures of the fibrous carbon nanohorn aggregate are entangled, the fibrous carbon nanohorn aggregate can also be made into a thin film without using a binder or the like. Even when a binder is used, the amount of the binder used can be reduced. Further, since the fibrous carbon nanohorn aggregate can be formed simultaneously with the globular carbon nanohorn aggregate being excellent in dispersibility, thus formed carbon nanohorn aggregate can easily be mixed with conventional fibrous materials, and a uniform planar structural body can also be produced.

The thickness of the planar structural body 1 can suitably be selected according to applications. However, the thickness of 100 nm to 10 mm is practically preferable.

When a thin film is made by using a paste of a globular structural body like the globular carbon nanohorn aggregate dispersed in a solvent or the like, since dispersibility is impaired and re-aggregation of the globular structural body occurs, it is difficult to fabricate a uniform sheet structure. However, a dispersion structure of the fibrous carbon nanohorn aggregate is maintained because the fibrous carbon nanohorn aggregate does not re-aggregate, it is possible to form a planar structural body including a uniform thin film. In addition, since the fibrous carbon nanohorn aggregate has high dispersibility, it is possible to easily mix other globular structural bodies and fibrous structural bodies thereto.

FIG. 2 is a transmission electron microscope (TEM) image of a fibrous carbon nanohorn aggregate according to the present invention. FIG. 3 is a TEM image of globular carbon nanohorn aggregates formed together with a fibrous carbon nanohorn aggregate by a method of the present invention. The single-walled carbon nanohorn constituting the fibrous carbon nanohorn aggregate according to the present example embodiment is the same as the single-walled carbon nanohorn constituting a conventional globular carbon nanohorn aggregate. A seed-shaped, a bud-shaped, a dahlia-shaped, a petal dahlia-shaped or a petal-shaped (a graphene sheet structure) carbon nanohorn aggregate is connected to form a fibrous carbon nanohorn aggregate. In other words, the fibrous structure includes one or more of these carbon nanohorn aggregates. Furthermore, since a target with a catalytic metal is evaporated to prepare a fibrous carbon nanohorn aggregate and a globular carbon nanohorn aggregate, the catalytic metal is found inside or outside the aggregates (non-transmissive particles in FIG. 2). When a fibrous carbon nanohorn aggregate is produced by the method according to the present invention, a globular carbon nanohorn aggregate is simultaneously produced.

FIG. 4 is a scanning electron microscope (SEM) image of fibrous carbon nanohorn aggregates and globular carbon nanohorn aggregates fabricated in the present invention. As shown in FIG. 4, the fibrous carbon nanohorn aggregate, since being fibrous, is hardly to re-aggregate, and since being made by aggregation of single-walled carbon nanohorns, has a structure excellent in dispersibility.

In the present description, fibrous carbon nanohorn aggregates and globular carbon nanohorn aggregates are collectively referred to simply as carbon nanohorn aggregates in some cases. Here, the fibrous carbon nanohorn aggregates and the globular carbon nanohorn aggregates can be separated by utilizing a centrifugal separation method, a difference in the settling rate after dispersion in a solvent, a gel permeation chromatography, or the like. Further, if impurities other than the carbon nanohorn aggregate are contained, the impurities can be removed by using a centrifugal separation method, a difference in settling rate or a difference in size. By changing a production condition, the ratio of the fibrous carbon nanohorn aggregate and the globular carbon nanohorn aggregate can be changed. "Fibrous" used here refers to a state in which the shape can be maintained to some degree even when the above-mentioned separating operation is carried out, and does not include a state in which a plurality of globular carbon nanohorn aggregates are simply strung and apparently look fibrous.

The fibrous carbon nanohorn aggregate according to the present invention suffices if single-walled carbon nanohorns are aggregated in a fibrous state, and is not limited to the above structure alone. Fine holes are formed on the single-walled carbon nanohorns of the carbon nanohorn aggregate, and substances can be introduced through the opening portions into the interior of the single-walled carbon nanohorns. Since the single-walled carbon nanohorn contains a structure other than a 6-membered ring on portions of a tip and a side surface thereof, such a structure is preferentially oxidized and opened by an oxidation treatment. Since the specific surface area is greatly improved by opening, the formation of opening portions becomes advantageous for the fabrication of a planar structural body preferably using a carbon nanohorn aggregate having a large specific surface area.

The each obtained single-walled carbon nanohorn has a diameter of about 1 nm to 5 nm, and a length of 30 nm to 100 nm. The fibrous carbon nanohorn aggregate can be made to have a diameter of about 30 nm to 200 nm, and a length of about 1 μm to 100 μm. By contrast, the globular carbon nanohorn aggregate has nearly a uniform size of a diameter of about 30 nm to 200 nm.

The obtained carbon nanohorn aggregates are formed as a seed-shaped, bud-shaped, dahlia-shaped, petal-dahlia-shaped or petal-shaped one singly or as a composite thereof. The seed-shaped one has almost no or no angular projections on the surface of the aggregate; the bud-shaped one has slightly angular projections on the surface of the aggregate; the dahlia-shaped one is a shape having many angular projections on the surface of the aggregate; and the petal-shaped one is a shape having petal-like projections on the surface of the aggregate. The petal structure is a graphene sheet structure having a width of 50 to 200 nm and a thickness of 0.34 to 10 nm and having 2 to 30 graphene sheets. The petal-dahlia-shaped one has an intermediate structure between the dahlia-shaped one and the petal-shaped one. The globular carbon nanohorn aggregates are separately produced in a mixed state with the fibrous carbon nanohorn aggregates. The form and the particle size of the produced carbon nanohorn aggregates vary depending on the kind and the flow volume of a gas.

A method for fabricating the fibrous carbon nanohorn aggregate involves using carbon containing a catalyst as a target (referred to as a catalyst-containing carbon target), and heating the catalyst-containing carbon target in a nitrogen atmosphere, an inert atmosphere, hydrogen, carbon dioxide or a mixed atmosphere by laser abrasion while the target is rotated in a vessel in which the target has been disposed, to thereby evaporate the target. In the course of cooling of the evaporated carbon and catalyst, fibrous carbon nanohorn aggregates and globular carbon nanohorn aggregate are obtained. Although methods using a carbon target containing a catalyst are partially known as production methods of carbon nanotubes, production of conventional carbon nanohorn aggregates (globular carbon nanohorn aggregates) uses a pure (100%) graphite target containing no catalyst. The fabrication method can also use an arc discharge method or a resistance heating method other than the above laser ablation method. The laser ablation method, however, is more preferable from the viewpoint of being capable of continuous production at room temperature and in the atmospheric pressure.

The laser ablation (LA) method applied in the present invention is a method in which a target is irradiated pulsatingly or continuously with a laser light, and when the irradiation intensity becomes a threshold value or higher, the target converts the energy and resultantly produces plumes to thereby deposit a product on a substrate installed on the downstream of the target, or produce a product in a space in the apparatus and recover the product in a recovery chamber.

For the laser ablation, there can be used $CO_2$ laser, YAG laser, excimer laser, semiconductor laser or the like, and $CO_2$ laser, which is easily made to be of a high power, is most suitable. The $CO_2$ laser can have a power of 1 $kW/cm^2$ to 1,000 $kW/cm^2$, and can carry out continuous irradiation and pulsating irradiation. For the production of carbon nanohorn aggregates, the continuous irradiation is more desirable. A laser light is condensed by a ZnSe lens or the like, and irradiated. Further, by making the target to rotate, the continuous synthesis can be made. The target rotation rate can be set optionally, but is especially preferably 0.1 to 6 rpm. When the rotation rate is 0.1 rpm or higher, the graphitization can be suppressed; and when being 6 rpm or lower, the increase of amorphous carbon can be suppressed. At this time, the laser output is preferably 15 $kW/cm^2$ or higher, and 30 to 300 $kW/cm^2$ is most effective. When the laser output is 15 $kW/cm^2$ or higher, the target is evaporated suitably to thereby make the production of carbon nanohorn aggregates easy. Further, when the laser output is 300 $kW/cm^2$, the increase of amorphous carbon can be suppressed. The pressure in the vessel (chamber) can be 13,332.2 hPa (10,000 Torr) or lower, but with the pressure nearer vacuum, carbon nanotubes are more easily produced and carbon nanohorn aggregates are more hardly obtained. Use of the pressure of preferably 666.61 hPa (500 Torr) to 1,266.56 hPa (950 Torr), and more preferably nearly normal pressure (1,013 hPa (1 atm≈760 Torr)) is suitable also for mass synthesis and cost reduction. Further, the irradiation area can be controlled according to the laser output and the degree of the light condensation by a lens, and can be 0.005 $cm^2$ to 1 $cm^2$.

As the catalyst, there can be used Fe, Ni or Co singly or in a mixture thereof. The concentration of the catalyst can suitably be selected and is, with respect to carbon, preferably 0.1% by mass to 10% by mass, and more preferably 0.5% by mass to 5% by mass. When the concentration is 0.1% by mass or higher, the production of fibrous carbon nanohorn aggregates is secured. Further, when the concentration is 10% by mass or lower, the increase of the target cost can be suppressed.

The temperature in the vessel can be optional, and use of preferably at 0 to 100° C. and more preferably at room temperature is suitable also for mass synthesis and cost reduction.

The atmosphere is made by introducing nitrogen gas, an inert gas, hydrogen gas, $CO_2$ gas or the like singly or a mixture thereof in the vessel. From the viewpoint of cost, nitrogen gas and Ar gas are preferable. The gas is circulated in the reaction vessel, and produced substances can be recovered on the flow of the gas. Also, a closed atmosphere may be made by the introduced gas. The atmosphere gas flow volume can be an optional volume, but is suitably in the range of 0.5 L/min to 100 L/min. In the course of the evaporation of the target, the gas flow volume is controlled at a constant rate. The gas flow volume can be made at a constant rate by making the supplied gas flow volume and the discharged gas flow volume to be coincident. In the case where the course is carried out nearly at normal pressure, the control can be made by pressing out and discharging the gas by the supplied gas.

In the fibrous carbon nanohorn aggregates and globular carbon nanohorn aggregates obtained as in the above, part of their carbon skeleton may be replaced by a catalyst metal element, a nitrogen atom and the like.

In the case where fine holes are opened on a carbon nanohorn aggregate, it can be carried out by an oxidation treatment. By the oxidation treatment, surface functional groups containing oxygen are formed on opening portions. Then, the oxidation treatment can use a gas phase process or a liquid phase process. In the case of the gas phase process, the oxidation treatment is carried out by carrying out a heat treatment in an atmosphere gas containing oxygen, such as air, oxygen or carbon dioxide. Among these, air is suitable from the viewpoint of cost. The temperature can be in the range of 300 to 650° C., and is more suitably 400 to 550° C. When the temperature is 300° C. or higher, there is no apprehension that carbon does not burn and no openings can be made. Further, when the temperature is 650° C. or lower, burning of the entire carbon nanohorn aggregate can be suppressed. In the case of the liquid phase process, the oxidation treatment is carried out in a liquid containing an oxidative substance such as nitric acid, sulfuric acid or hydrogen peroxide. In the case of nitric acid, it can be used in the temperature range of room temperature to 120° C. When the temperature is 120° C. or lower, the oxidizing power never becomes too high and the oxidation never occurs than necessary. In the case of hydrogen peroxide, it can be used in the temperature range of room temperature to 100° C., and 40° C. or higher is preferable. In the temperature range of 40° C. to 100° C., the oxidizing power efficiently acts and can efficiently form openings. Further, in the case of the liquid process, combined use with light irradiation is more effective.

The catalyst metal contained in the production of the carbon nanohorn aggregate can be removed before the oxidation treatment. The catalyst metal, since being dissolved in nitric acid, sulfuric acid or hydrochloric acid, can be removed. Hydrochloric acid is suitable from the viewpoint of easy usage. The temperature at which the catalyst is dissolved can suitably be selected, and if the catalyst is to be sufficiently removed, the removal is desirably carried out by heating at 70° C. or higher. Then in the case of using nitric acid or sulfuric acid, the removal of the catalyst and the formation of openings can be carried out simultaneously or sequentially. Further, since there may be the case where the catalyst is covered with a carbon film in the production of the carbon nanohorn aggregate, a pre-treatment to remove the carbon film is desirably carried out. The pre-treatment is desirably carried out by heating at about 250 to 450° C. in air. Although the heating at 300° C. or higher partially forms openings in some cases as described above, the formation of openings in the present invention, since being a preferable aspect depending on applications, poses no problem.

The obtained carbon nanohorn aggregate can be improved in the crystallinity by being heat treated in a non-oxidative atmosphere such as an inert gas, hydrogen or vacuum. The heat treatment temperature can be 800 to 2,000° C., but is preferably 1,000 to 1,500° C. After the opening treatment, surface functional groups containing oxygen are formed on the opening portions, but can also be removed by a heat treatment. The temperature of the heat treatment can be 150 to 2,000° C. In order to remove carboxyl groups, hydroxy groups and the like as the surface functional groups, 150° C. to 600° C. is desirable. The removal of carbonyl groups and the like as the surface functional groups is desirably at 600° C. or higher. Further, the surface functional groups can be removed by reduction in a gas or liquid atmosphere. The reduction in the gas atmosphere can use hydrogen, which can be in a combined use with the above improvement in the crystallinity. In the liquid atmosphere, hydrazine or the like can be used.

A mixture of the fibrous carbon nanohorn aggregate and the globular carbon nanohorn aggregate (hereinafter, referred to also as a carbon nanohorn aggregate mixture) as it is, the fibrous carbon nanohorn aggregate isolated, and these after the opening portions are formed, are made into a thin film and can be used as the planar structural body.

Further the planar structural body according to the present invention may include at least one mixing material of carbon, a carbon compound, a metal, a semimetal and an oxide. As the carbon, there can be used one or more selected from, for example, graphite, graphitizable carbon, non-graphitizable carbon, active carbon, carbon black such as acetylene black and Ketjen black, a carbon nanotube and graphene. Examples of the carbon compound include silicon carbide, nitrogen carbide and silicon carbonitride. As the metal, there can be used one or more selected from iron, nickel, manganese, copper, silver, gold, platinum, aluminum, titanium, zinc and chromium. As the semimetal, at least one of boron and silicon can be used. As the oxide, one or more of oxides of the above metal or semimetal can be used.

A method for producing the planar structural body involves, for example, dispersing a carbon nanohorn aggregate mixture and as required the above mixing material in a suitable solvent such as an alcohol, and applying and drying the obtained dispersion liquid on a substrate. The carbon nanohorn aggregate mixture can be made into a thin film without using any binder, but a binder may be used. As the binder, various types of resin materials can be used, and preferable is one or more selected from polyvinylidene fluoride, an acrylic resin, styrene butadiene rubber, an imide-based resin, an imideamide-based resin, a polytetrafluoroethylene resin and a polyamide resin. In the present invention, the amount of the binder can be reduced more than in the case of conventional carbon materials; for example, when an electrode material for an electric double layer capacitor is made as described later, the amount of the binder unnecessary for the capacity can be reduced, and a capacitor having high-capacity can be obtained.

The planar structural body including the fibrous carbon nanohorn aggregate can be used for various applications making use of characteristics of the carbon nanohorn aggregate. The carbon nanohorn aggregate contributes to improvement in the conductivity when the fibrous structures are made into a thin film as a conductive path. The planar structural body is excellent also in catalytic activity, adsorbability and absorbability, and thermal conduction. The planar structural body can be used for electrode materials for, for example, lithium ion batteries, fuel cells, capacitors, electrochemical actuators, air cells and solar cells. Further, the planar structural body can be used also for electromagnetic shields, thermoconductive sheets, heat-dissipating sheets, protecting sheets, filters and absorbing materials.

EXAMPLES

Hereinafter, the present invention will be described in more detail by way of Examples. Of course, the present invention is not limited to the following Examples.

Example 1

A carbon target containing about 5% by mass of iron was irradiated with a $CO_2$ laser in a nitrogen atmosphere to thereby fabricate fibrous carbon nanohorn aggregates and globular carbon nanohorn aggregates (Sample 1). Experiment details will be described hereinafter. The carbon target containing iron was rotated at 2 rpm. The energy density of the $CO_2$ laser was 150 kW/cm$^2$ in continuous irradiation, and the temperature of a chamber was room temperature. The gas flow volume in the chamber was regulated so as to become 10 L/min. The pressure was controlled at 933.254 to 1,266.559 hPa (700 to 950 Torr). Further, as a comparative sample, there was also fabricated a sample having been subjected to laser ablation by using a carbon target containing no catalyst and in a nitrogen atmosphere and under the same other conditions (Sample 2).

FIG. 4 is an SEM image of Sample 1. Fibrous and globular substances were observed. The fibrous one had a diameter of about 30 to 100 nm, and a length of a few micrometers to several tens of micrometers. The globular one had a diameter of about 30 to 200 nm, in which a nearly uniform size accounted for many thereof. FIG. 2 and FIG. 3 are TEM images of products. From observation results, it was found that the fibrous substance was so made that single-walled carbon nanohorns of about 1 to 5 nm in diameter and about 40 to 50 nm in length were aggregated in a fibrous state. Then, globular substances other than the fibrous substances were also observed, and it was found that seed-shaped, bud-shaped, dahlia-shaped and petal dahlia-shaped carbon nanohorn aggregates were mixed. Further, black particles of iron were also observed, and it was found that the particles were present in the interior or on the surface of the fibrous carbon nanohorn aggregates and the globular carbon nanohorn aggregates. By contrast, in Sample 2, globular substances were observed, but no fibrous substances were observed.

Sample 1 (1 mg) was mixed with 30 ml of ethanol, and ultrasonically dispersed for 15 minutes to thereby fabricate a dispersion liquid. The obtained dispersion liquid was dropped on a silicon substrate, and dried. The process was repeated until the film thickness became 1 μm. A laser microscope image of an obtained thin film is shown in FIG. 5. As a result, it was confirmed that a uniform film was formed. FIG. 6 shows a thin film of Sample 2 fabricated by the same method. As a result, it was confirmed that nonuniform irregularities and cracks were formed on the surface. It is considered that in Sample 1, when the ethanol was dried, the fibrous structures prevented the re-aggregation of the globular aggregates and the fibrous structures were entangled, and thus a uniform state was maintained.

Thin films using Sample 3 (active carbon (YP50F, manufactured by Kuraray Co., Ltd.)) and Sample 4 (a mixture of Sample 3 and Sample 1 in 1:1) were fabricated by the same method as in Sample 1.

The sheet resistivities of the thin films using Samples 1 to 4 were measured. The resistivity measurement was carried out by arranging 4 probe needles of a prober in a line, making a current I to flow to the outer pair of the electrodes, and measuring a voltage V between the inner pair of the electrodes. The acquired sheet resistivities of Samples 1, 2, 3 and 4 were 1 Ωkm, 15 Ωkm, 25 Ωcm and 10 Ωkm, respectively. From the results, it was found that Sample 1, having a uniform thin film and being excellent in conductivity, had the lowest resistivity. Then, Sample 2 and Sample 3, with which it was difficult to make a uniform thin film, had high resistivities. Further, Sample 4 exhibited a reduced resistivity because the thin film of Sample 3 was uniformized by addition of Sample 1.

Example 2

Electrode Materials for Electric Double Layer Capacitors

80% by mass of Sample 1 or Sample 2 and 20% by mass of PVDF were mixed; and N-methyl-2-pyrrolidinone was further mixed and fully stirred to thereby fabricate a paste. The obtained paste was applied on an Al current collector to a thickness of about 100 μm. Thereafter, the resultant was dried at 120° C. for 10 minutes, and press molded with a roll press into an electrode body. Further, the electrode body was vacuum dried at 60° C. for 24 hours, and punched out into circles having a diameter of 12 mm to thereby obtain electrode plates (positive electrode, negative electrode) for an electric double layer capacitor. Coin cells were fabricated (Sample A, Sample B) by using these positive electrode and negative electrode, a PC (propylene carbonate) solution containing 1 M/L $(CH_3(CH_2)_3)_4N.BF_4$ as an electrolyte solution and a glass filter as a separator. Sample 1 and Sample 2 were heated in air at 450° C. and 500° C., respectively, to thereby obtain Sample 5 and Sample 6 having been subjected to the oxidation treatment, respectively; and respective coin cells were fabricated (Sample C, Sample D). In Sample 5 and Sample 6, on the single-walled carbon nanohorns, openings were made and the interior thereof came to be able to be used, and the specific surface areas became about 4 times. The coin cells (Samples A to D) were each set on a charge and discharge tester, and charged and discharged between a voltage of 0 V and a voltage of 2.5 V at a constant current. The rate characteristics (fast charge and discharge properties) were evaluated as discharge characteristics at 0.1, 1 and 10 A/g in the same voltage range as above (Table 1). The capacity at the low rate was the largest in Sample C, and it was found that the capacity was determined depending on the specific surface area. At the high rate, Sample A and Sample C exhibited a low reduction in the capacity due to the increase in the discharge rate. This is because the electrode film including the fibrous carbon nanohorn aggregate was uniformly fabricated, so that the internal resistance of the electrode was reduced.

TABLE 1

|  | 0.1 A/g | 1 A/g | 10 A/g |
|---|---|---|---|
| Sample A (electrostatic capacity (F/g)) | 30 | 28 | 20 |
| Sample B (electrostatic capacity (F/g)) | 28 | 25 | 10 |
| Sample C (electrostatic capacity (F/g)) | 42 | 40 | 26 |
| Sample D (electrostatic capacity (F/g)) | 38 | 35 | 15 |

INDUSTRIAL APPLICABILITY

The planar structural body according to the present invention can be used for electrode materials for lithium ion batteries, fuel cells, capacitors, electrochemical actuators, air cells and solar cells. Further the planar structural body can be used also for electromagnetic shields, thermoconductive sheets, heat-dissipating sheets, protecting sheets, filters and absorbing materials.

The example embodiment includes constitutions described in the following Supplementary Notes, but is not limited to these constitutions.

(Supplementary Note 1)

A planar structural body, comprising a fibrous carbon nanohorn aggregate in which a plurality of single-walled carbon nanohorns are aggregated in a fibrous state.

(Supplementary Note 2)

The planar structural body according to Supplementary Note 1, wherein the fibrous carbon nanohorn aggregate has a diameter of 30 nm to 200 nm, and a length of 1 μm to 100 μm.

(Supplementary Note 3)

The planar structural body according to Supplementary Note 1 or 2, wherein each of the single-walled carbon nanohorns has a diameter of 1 nm to 5 nm, and a length of 30 nm to 100 nm, and has a horn-shaped tip.

(Supplementary Note 4)

The planar structural body according to any one of Supplementary Notes 1 to 3, comprising at least one of seed-shaped, bud-shaped, dahlia-shaped, petal dahlia-shaped and petal-shaped carbon nanohorn aggregates, connected in a fibrous state.

(Supplementary Note 5)

The planar structural body according to any one of Supplementary Notes 1 to 4, comprising at least one of seed-shaped, bud-shaped, dahlia-shaped, petal dahlia-shaped and petal-shaped globular carbon nanohorn aggregates, not constituting the fibrous carbon nanohorn aggregate.

(Supplementary Note 6)

The planar structural body according to any one of Supplementary Notes 1 to 5, wherein a part of each of the single-walled carbon nanohorns has an opening portion.

(Supplementary Note 7)

The planar structural body according to any one of Supplementary Notes 1 to 6, further comprising at least one of carbon, a carbon compound, a metal, a semimetal and an oxide.

(Supplementary Note 8)

The planar structural body according to Supplementary Note 7, wherein the carbon is one or more selected from graphite, graphitizable carbon, non-graphitizable carbon, active carbon, carbon black, a carbon nanotube and graphene; the metal is one or more selected from iron, nickel, manganese, copper, silver, gold, platinum, aluminum, titanium, zinc and chromium; the semimetal is at least one of boron and silicon; and the oxide is one or more of oxides of the metals and the semimetals.

(Supplementary Note 9)

The planar structural body according to any one of Supplementary Notes 1 to 8, further comprising a binder.

(Supplementary Note 10)

The planar structural body according to any one of Supplementary Notes 1 to 9, wherein the planar structural body has a thickness of 100 nm to 10 mm.

(Supplementary Note 11)

The planar structural body according to any one of Supplementary Notes 1 to 10, wherein the planar structural body is an electrode material of a lithium ion battery.

(Supplementary Note 12)

The planar structural body according to any one of Supplementary Notes 1 to 10, wherein the planar structural body is an electrode material of a fuel cell.

(Supplementary Note 13)

The planar structural body according to any one of Supplementary Notes 1 to 10, wherein the planar structural body is an electrode material of a capacitor.

(Supplementary Note 14)

The planar structural body according to Supplementary Note 13, wherein the capacitor is an electric double layer capacitor.

(Supplementary Note 15)

The planar structural body according to any one of Supplementary Notes 1 to 10, wherein the planar structural body is an electrode material of an electrochemical actuator.

(Supplementary Note 16)

The planar structural body according to any one of Supplementary Notes 1 to 10, wherein the planar structural body is an electrode material of an air cell.

(Supplementary Note 17)

The planar structural body according to any one of Supplementary Notes 1 to 10, wherein the planar structural body is an electrode material of a solar cell.

(Supplementary Note 18)

The planar structural body according to any one of Supplementary Notes 1 to 10, wherein the planar structural body is an electromagnetic shield.

(Supplementary Note 19)

The planar structural body according to any one of Supplementary Notes 1 to 10, wherein the planar structural body is a thermoconductive sheet.

(Supplementary Note 20)

The planar structural body according to any one of Supplementary Notes 1 to 10, wherein the planar structural body is a heat-dissipating sheet.

(Supplementary Note 21)

The planar structural body according to any one of Supplementary Notes 1 to 10, wherein the planar structural body is a protecting sheet.

(Supplementary Note 22)

The planar structural body according to any one of Supplementary Notes 1 to 10, wherein the planar structural body is a filter.

(Supplementary Note 23)

The planar structural body according to Supplementary Note 22, wherein the filter causes gases or liquids consisting of a plurality of components to permeate, and adsorbs a part of the components.

(Supplementary Note 24)

The planar structural body according to Supplementary Note 22, wherein the filter is a dust-collecting filter.

(Supplementary Note 25)

The planar structural body according to Supplementary Note 24, wherein the dust-collecting filter collects dust electrostatistically.

(Supplementary Note 26)

The planar structural body according to any one of Supplementary Notes 1 to 10, wherein the planar structural body is an absorbing material.

(Supplementary Note 27)

The planar structural body according to Supplementary Note 26, wherein the absorbing material absorbs a gas or a liquid.

(Supplementary Note 28)

The planar structural body according to Supplementary Note 26, wherein the absorbing material absorbs a sustained-release substance.

Hitherto, the present invention has been described by reference to the example embodiment and the Examples, but the present invention is not limited to the above example embodiment and Examples. Various changes and modifications of the constitution and the details of the present invention, understandable to those skilled in the art, may be made within the scope of the present invention.

REFERENCE SIGNS LIST

1 PLANAR STRUCTURAL BODY
2 FIBROUS CARBON NANOHORN AGGREGATE
3 GLOBULAR CARBON NANOHORN AGGREGATE

The invention claimed is:

1. A planar structural body, comprising a mixture of a fibrous carbon nanohorn aggregate and a globular aggregate of carbon nanohorn, wherein the fibrous carbon nanohorn aggregate comprises a plurality of single-walled carbon nanohorns aggregated in a fibrous state, wherein the globular aggregate of carbon nanohorn comprises at least one of seed-shaped, bud-shaped, dahlia-shaped, petal dahlia-shaped, and petal-shaped globular carbon nanohorn aggregates.

2. The planar structural body according to claim 1, wherein the fibrous carbon nanohorn aggregate has a diameter of 30 nm to 200 nm, and a length of 1 µm to 100 µm.

3. The planar structural body according to claim 1, wherein each of the single-walled carbon nanohorns has a diameter of 1 nm to 5 nm, and a length of 30 nm to 100 nm, and has a horn-shaped tip.

4. The planar structural body according to claim 1, comprising at least one of seed-shaped, bud-shaped, dahlia-shaped, petal dahlia-shaped and petal-shaped carbon nanohorn aggregates, connected in a fibrous state.

5. The planar structural body according to claim 1, wherein a part of each of the single-walled carbon nanohorns has an opening portion.

6. The planar structural body according to claim 1, further comprising at least one of carbon, a carbon compound, a metal, a semimetal and an oxide.

7. The planar structural body according to claim 6, wherein the carbon is one or more selected from graphite, graphitizable carbon, non-graphitizable carbon, active carbon, carbon black, a carbon nanotube and graphene; the metal is one or more selected from iron, nickel, manganese, copper, silver, gold, platinum, aluminum, titanium, zinc and chromium; the semimetal is at least one of boron and silicon; and the oxide is one or more of oxides of the metals and the semimetals.

8. The planar structural body according to claim 1, further comprising a binder.

9. The planar structural body according to claim 1, wherein the planar structural body has a thickness of 100 nm to 10 mm.

10. The planar structural body according to claim 1, wherein the planar structural body is an electrode material of a lithium ion battery.

11. The planar structural body according to claim 1, wherein the planar structural body is an electrode material of a fuel cell.

12. The planar structural body according to claim 1, wherein the planar structural body is an electrode material of a capacitor.

13. The planar structural body according to claim 1, wherein the planar structural body is an electrode material of an electrochemical actuator.

14. The planar structural body according to claim 1, wherein the planar structural body is an electrode material of an air cell.

15. The planar structural body according to claim 1, wherein the planar structural body is an electrode material of a solar cell.

16. The planar structural body according to claim 1, wherein the planar structural body is an electromagnetic shield.

17. The planar structural body according to claim 1, wherein the planar structural body is a thermoconductive sheet.

18. The planar structural body according to claim 1, wherein the planar structural body is a heat-dissipating sheet.

19. The planar structural body according to claim 1, wherein the planar structural body is a filter causing gases or liquids consisting of a plurality of components to permeate, and adsorbing a part of the components.

* * * * *